(12) United States Patent
Liu et al.

(10) Patent No.: US 9,611,564 B2
(45) Date of Patent: Apr. 4, 2017

(54) METHOD FOR GROWING A BULK SINGLE CRYSTAL NITRIDE MATERIAL

(71) Applicant: DONGGUAN INSTITUTE OF OPTO-ELECTRONICS PEKING UNIVERSITY, Guangdong (CN)

(72) Inventors: Nanliu Liu, Guangdong (CN); Zhiwen Liang, Guangdong (CN); Jiao Chen, Guangdong (CN); Guoyi Zhang, Guangdong (CN)

(*) Notice: Subject to any disclaimer, the term of this patent is extended or adjusted under 35 U.S.C. 154(b) by 95 days.

(21) Appl. No.: 14/647,835

(22) PCT Filed: Jul. 9, 2014

(86) PCT No.: PCT/CN2014/081877
§ 371 (c)(1),
(2) Date: May 28, 2015

(87) PCT Pub. No.: WO2015/058559
PCT Pub. Date: Apr. 30, 2015

(65) Prior Publication Data
US 2015/0292108 A1    Oct. 15, 2015

(30) Foreign Application Priority Data
Oct. 22, 2013    (CN) .......................... 2013 1 0498099

(51) Int. Cl.
*C30B 19/10* (2006.01)
*C30B 7/10* (2006.01)
(Continued)

(52) U.S. Cl.
CPC ................ *C30B 7/105* (2013.01); *C30B 9/12* (2013.01); *C30B 19/02* (2013.01); *C30B 19/06* (2013.01); *C30B 19/10* (2013.01); *C30B 29/406* (2013.01)

(58) Field of Classification Search
CPC .. C30B 7/00; C30B 7/005; C30B 7/10; C30B 7/105; C30B 9/00; C30B 9/04; C30B 9/08; C30B 9/12; C30B 19/00; C30B 19/02; C30B 19/06; C30B 19/10; C30B 19/106; C30B 29/00; C30B 29/10; C30B 29/40; C30B 29/403; C30B 29/406; C30B 35/00;
(Continued)

(56) References Cited

U.S. PATENT DOCUMENTS

3,486,937 A * 12/1969 Linares .................... C30B 19/02
117/59
4,066,481 A * 1/1978 Manasevit .............. C30B 25/02
117/104
(Continued)

*Primary Examiner* — Kenneth A Bratland, Jr.
(74) *Attorney, Agent, or Firm* — Prakash Nama; Global IP Services, PLLC (57) ABSTRACT

An apparatus and method for growing nitride bulk single crystal, including an autoclave having a pre-growth zone and a growth zone. With control of the concentration of a saturated solution in a pre-growth chamber, the oversaturation reaction conditions for the overall process of growth of the nitride bulk single crystal can be regulated. By regulating the liquid level difference of the melt on an upper surface of a seed crystal, nucleation growth of N/Ga is preferentially performed on the surface of the seed crystal, which suppresses polycrystal formation at a gas-liquid interface and improves the growth rate of crystal and the utilization rate of raw materials.

3 Claims, 5 Drawing Sheets (51) Int. Cl.
*C30B 19/06* (2006.01)
*C30B 9/12* (2006.01)
*C30B 19/02* (2006.01)
*C30B 29/40* (2006.01)

(58) Field of Classification Search
CPC ... C30B 35/002; C30B 35/005; Y10T 117/00; Y10T 117/10; Y10T 117/1004; Y10T 117/1008; Y10T 117/1016; Y10T 117/1024; Y10T 117/1096
USPC .... 117/11, 54–56, 64, 68–71, 73–74, 77–78, 117/200–202, 204, 206, 224, 937, 952
See application file for complete search history.

(56) References Cited

U.S. PATENT DOCUMENTS

2001/0054377 A1* 12/2001 Lindfors ............. C23C 16/4402
117/104
2010/0294195 A1* 11/2010 Katou .................. C30B 29/403
117/73

* cited by examiner

METHOD FOR GROWING A BULK SINGLE CRYSTAL NITRIDE MATERIAL

BACKGROUND OF THE INVENTION

The invention relates to the field of semiconductor optoelectronic materials, and especially to a novel apparatus and method for bulk nitride single crystal growth with liquid phase epitaxy.

GaN is the third generation of semiconductor material, and due to its features such as broad band gap, high pressure resistance, and high thermal conductivity, GaN has a wide market prospect in the field of high-end GaN-based optoelectronic devices in manufacturing high power LEDs/Ds, high-frequency and high-speed microwave detectors, etc., which has attracted wide attention in the industry.

Since the GaN material is decomposed into gallium and nitrogen under normal pressure and at a temperature of 877° C., the melting of GaN can only be achieved at a high temperature and under high pressure (2220° C., 6 GPa). Free-standing GaN substrate is difficult to obtain using the traditional Czochralski method (also known as the vertical pulling method, Czochralski process, or CZ method) for preparing a single crystal semiconductor substrate such as silicon and gallium arsenide substrate. Deficiency of free-standing GaN substrate forces present. GaN-based devices to be manufactured by using heteroepitaxy technology. Lattice and thermal stress mismatches between the epitaxial material and the heterogeneous substrate lead to high dislocation density of the epitaxial layer, and affects performance of the device. Therefore, using homoepitaxy technology for developing a high-quality free-standing GaN substrate is the key to achieving high power LEDs/LDs and high-frequency and high-efficiency microwave power GaN-based devices.

Currently, the method for preparing bulk GaN crystal mainly includes hydride vapor phase epitaxy technology (HVPE), high temperature and high pressure method (HPNS), the Na Flux method, ammothermal growth method, and the like. HVPE has a fast growth rate and can produce a large-sized single crystal material, but the prepared GaN single crystal has problems such as high dislocation density ($\sim 106$ cm$-2$) and residual stress. GaN single crystal prepared by HPNS has good quality ($\sim 102$ cm$-2$) but rigorous growth conditions (1700° C., 2 GPa). A crystal synthesized by using the ammothermal growth method also has good quality ($\sim 103$ cm$-2$) but a slow crystal growth rate and high requirement of laboratory equipment, which is adverse to industrialized production. Moreover, Na Flux has moderate growth conditions (700-1000° C., 4-5 MPa) and good crystal quality ($\sim 104$ cm$-2$) and is currently the best way to prepare GaN bulk single crystal. Currently, Na Flux growing of GaN has made some progress, bulk GaN single crystal with a diameter larger than 2 inches and a thickness more than 2 cm has been obtained. However, the traditional autoclave generally has only one chamber for mixing the raw materials and the seed crystal together and then is directly heated for single crystal growth. As such, during the period of initial heating-pressurizing and later cooling process, the raw material solution inevitably contacts the surface of the seed crystal when the growth conditions for the single crystal are not met, forming a polycrystal GaN and other intermediate phase products and thus affecting the crystal quality of the material. At the same time, the GaN polycrystal is formed at the gas-liquid interface, which causes slow growth rate of the crystal and low utilization rate of raw materials, which is an insurmountable defect of the traditional single-chamber autoclave.

BRIEF SUMMARY OF THE INVENTION

The invention provides a novel autoclave apparatus and a method for growth of bulk GaN, which combines the reaction conditions and principle of dynamics of Na Flux, achieves preferential growth of the crystal nucleus on the surface of a seed crystal in the growth process of nitride, suppresses the formation of polycrystal nitride at the gas-liquid interface, improves the growth rate and the crystal quality of bulk GaN, and efficiently overcomes the defect of the traditional single-chamber autoclave.

The autoclave designed in the invention comprises a crystal pre-growth chamber and a crystal growth chamber connected with each other. The crystal pre-growth chamber of the autoclave has a feature and a function for controlling the raw material conditions, while the crystal growth chamber has a feature and a function for controlling growth kinetics conditions. A communication control apparatus is arranged at the connection channel between the crystal pre-growth chamber and the crystal growth chamber. The above mentioned chambers can be communicated directly or indirectly through a thermal insulation pipe or a transition chamber. Therefore, the connection between the crystal pre-growth chamber and the crystal growth chamber can be the direct connection part of the two chambers, can be the thermal insulation pipe connecting the crystal pre-growth chamber with the crystal growth zone chamber, be the part connecting the transition chamber with the crystal pre-growth chamber, be the part connecting the transition chamber with the crystal growth chamber and the connection part between every two transition chambers.

Specifically, the following technical solutions are adopted:

The invention designs an apparatus for growing nitride bulk single crystal. The apparatus is an autoclave capable of withstanding high temperature and high pressure. The core structure of the autoclave comprises a crystal pre-growth chamber and a crystal growth chamber connected with each other. The exteriors of the outer side and the bottom of the crystal pre-growth chamber are provided with a heating apparatus. The exteriors of the outer side and the bottom of the crystal growth chamber are provided with a heating apparatus. Communication control apparatuses for controlling connection or separation are arranged between the crystal pre-growth chamber and the crystal growth chamber. The communication control apparatus is arranged above the crystal pre-growth chamber, and above the crystal growth chamber. The communication control apparatuses are connected with a gas storage tank through a nitrogen-containing reactant gas delivery pipe.

As a further description of the abovementioned apparatus for growing nitride bulk single crystal, a gauze filter is arranged on one side of the communication control apparatus for preventing the undissolved raw materials from entering the crystal growth chamber to reduce impurities of crystal.

As a further description of the abovementioned apparatus for growing nitride bulk single crystal, a seed crystal template is placed in the crystal growth chamber; the seed crystal template can simply be a sapphire substrate, a silicon carbide substrate, a silicon substrate, or a GaN template formed by depositing a nitride film on any of the abovementioned substrates or free-standing nitride substrate; the surface of the abovementioned substrate is c plane or nonpolar or semi-polar.

As another solution of the abovementioned apparatus for growing nitride bulk single crystal, the autoclave comprises a crystal pre-growth chamber and a crystal growth chamber connected with each other. At least one transition chamber is communicated between the crystal pre-growth chamber and the crystal growth chamber. The exteriors of the outer side and the bottom of the crystal pre-growth chamber are provided with a heating apparatus. The exteriors of the outer side and the bottom of the crystal growth chamber are provided with a heating apparatus. The exteriors of the outer side and the bottom of each transition chamber are provided with a heating apparatus. The communication control apparatuses for controlling conection or separation are respectively arranged at the communications between the transition chambers and the crystal pre-growth chamber and the crystal growth chamber. The communication control apparatuses are respectively arranged above the crystal pre-growth chamber, the crystal growth chamber, and the transition chamber. The communication control apparatuses are connected with the gas storage tank through the nitrogen-containing reactant gas delivery pipe.

As further improvement of the abovementioned transition chamber for growing nitride bulk single crystal, a gauze filter is arranged on one side of each of the communication control apparatuses for controlling communication or separation with the transition chamber. A gauze filter is arranged between every two transition chambers for preventing the undissolved raw materials from entering the next transition chamber or reducing impurities in the crystal.

The crystal pre-growth chamber is used for dissolving the raw materials with pressurizing and heating. The crystal growth chamber is used for growing the nitride bulk single crystal.

The invention further provides a method for growing nitride bulk single crystal, comprising the following steps:

A. arranging a crystal pre-growth chamber, a crystal growth chamber and a communication control apparatus located between the abovementioned two chambers, placing a seed crystal in the crystal growth chamber, and switching off the communication control apparatus between the abovementioned two chambers;

B. introducing raw materials in the crystal pre-growth chamber; when the raw materials are dissolved to meet the stable oversaturation conditions required by the growth, switching on the communication control apparatus, wherein the raw materials comprise Ga or Al or In, and a mixture of alkali metals and alkaline-earth metals, and nitrogen-containing reactant gasses which comprise nitrogen or ammonia gasses, or a mixture of nitrogen and ammonia gasses; and C. entering the raw material solution in the stable oversaturation state into the crystal growth chamber and starting crystal growth.

As a preferred solution to the abovementioned method for growing nitride bulk single crystal, a gauze filter for reducing impurity of crystal is arranged between the crystal pre-growth chamber and the crystal growth chamber for preventing the undissolved raw materials or impurities from entering the crystal growth chamber.

As a further description of the abovementioned method for growing nitride bulk single crystal, it comprises: in the crystal growth process, regulating the pressure difference between the crystal pre-growth chamber and the crystal growth chamber, thereby regulating the liquid level difference between the two chambers so as to adjust the surface of the seed crystal to the liquid level difference ΔH, restricting the distance Δh between the surface of melt and the upper surface of the seed crystal in the growth chamber meet with the diffusion free path of the N ions at the growth conditions; after the crystal growth is completed, regulating the pressure difference between the crystal pre-growth chamber and the crystal growth chamber to force the raw material solution in the crystal growth to flow back to the crystal pre-growth chamber; and so, when the liquid level of the raw material solution is lower than the upper surface of the nitride bulk single crystal, the contact between the surface of the nitride bulk single crystal and the raw material solution is terminated.

As another preferred solution to the method for growing nitride bulk single crystal, it comprises the following steps:

A. arranging a crystal pre-growth chamber, a crystal growth chamber, at least one transition chamber for communicating the crystal pre-growth chamber with the crystal growth chamber and communication control apparatuses; placing a seed crystal in the crystal growth chamber; and switching off the communication control apparatuses;

B. introducing raw materials into the crystal pre-growth chamber; when the raw materials are dissolved to meet the stable oversaturation conditions required by the growth, switching on the communication control apparatus between the crystal pre-growth chamber and the adjacent transition chamber; and the raw material solution and impurities of the crystal entering into the transition chamber, wherein the raw materials comprise Ga or Al or In, and a mixture of alkali metals and alkaline-earth metals, and nitrogen-containing reactant gasses which comprise nitrogen or ammonia gasses or a mixture of nitrogen and ammonia gasses; and C. switching on the communication control apparatus between the crystal growth chamber and the adjacent transition chamber, entering the raw material solution in a stable oversaturation state into the crystal growth chamber and starting crystal growth.

As a further description of the abovementioned method for growing nitride bulk single crystal, comprising at least one transition chamber, in the growth process of the crystal, the flow process of the raw material solution in the stable oversaturation state comprises: by regulating the pressure difference between the crystal pre-growth chamber and the adjacent transition chamber, terminating the communication between the crystal pre-growth chamber and the adjacent transition chamber after the raw material solution in the oversaturation state enters the adjacent transition chamber wherein the internal liquid level of the crystal pre-growth chamber is lower than that of the adjacent transition chamber; when the number of the transition chambers is two or more, by regulating the pressure difference between the two adjacent transition chambers, terminating the communication of the two adjacent transition chambers after the raw material solution in the stable oversaturation state enters the next transition chamber;

entering the raw material solution in the stable oversaturation state into the transition chamber adjacent to the crystal growth chamber; by regulating the pressure difference between the crystal growth chamber and the adjacent transition chamber, regulating the liquid level difference ΔH of the two chambers so as to adjust the difference Δh from the surface of the seed crystal to the liquid level, controlling Δh from the liquid surface of the raw material solution in the growth chamber to the upper surface of the seed crystal meet with the diffusion free path of N ions at the growth conditions;

after the crystal growth is completed, the flow process of the raw material solution in the stable oversaturation state comprises: regulating the pressure difference between the crystal growth chamber and the adjacent transition chamber to force the raw material solution in the crystal growth to flow back to the adjacent transition chamber; so, when the liquid level of the raw material solution flowing back is lower than the upper surface of the bulk single crystal material, the contact between the surface of the nitride bulk single crystal and the growth solution is terminated.

As a preferred solution to the abovementioned method for growing nitride bulk single crystal, comprising at least one transition chamber, a gauze filter is arranged between the crystal pre-growth chamber and the adjacent transition chamber for preventing the undissolved raw materials and impurities of the crystal from entering the transition chamber; a gauze filter is arranged between the crystal growth chamber and the adjacent transition chamber for preventing the undissolved raw materials and impurities of the crystal from entering the crystal growth chamber; and a profound gauze filter is arranged between the two adjacent transition chambers for preventing the undissolved raw materials and impurities of the crystal from entering the next transition chamber.

In the abovementioned method for growing nitride bulk single crystal, the growth method of the crystal can be both spontaneous nucleation and induced growth of seed crystal template.

Among the above, each abovementioned communication control apparatus is preferably a valve.

As compared to the traditional autoclave apparatus for nitride bulk single crystal, the novelty of the design structure of the invention lies in having two or more control chambers, combining the principle of dynamics of Na Flux for growing nitride, and flexibly controlling the growth conditions in the chambers by valves, flow gauges, pressure controllers, etc. The formation of nitride polycrystal can only be suppressed when the nitride single crystal in the Na Flux grows under the oversaturation conditions of N concentration in the raw material solution. Since the traditional autoclave apparatus is a single chamber, the raw materials may start growth to yield polycrystal nitride or multi-phase nitride due to contact with the seed crystal when the growth conditions in the heating stage do not reach the stable oversaturation state. Moreover, the structure of the autoclave apparatus designed in the invention overcomes the defect of the single chamber of the traditional autoclave apparatus on condition control. Since the invention designs a crystal pre-growth chamber, in the heating process of the early stage of growth, condition control is conducted on the raw materials in the crystal pre-growth chamber, and at this point the crystal pre-growth chamber is isolated from the crystal growth chamber. When the conditions required by growth of the raw materials are met in the crystal pre-growth chamber, the valve is opened, the crystal pre-growth chamber and the crystal growth chamber are connected with each other, and the raw material solution enters the crystal growth chamber and contacts the seed crystal to start growth. The temperature and pressure of the crystal growth chamber are controlled by an independent heat source and a gas path. Meanwhile, the invention skillfully controls the difference $\Delta h$ from the liquid level of melt to the upper surface of the seed crystal in the crystal growth chamber by using the pressure difference between two chambers, so that N ions can reach the surface of the seed crystal within an effective free path diffusion range in the melt, thereby achieving preferential nucleation on the surface of the seed crystal, and suppressing spontaneous nucleation at the gas-liquid interface, which enable the nitrogen to enter the solution and supplement the consumption of N in the growth process of nitride in time, which efficiently keeps the oversaturation solubility of N in the melt, always maintaining the oversaturation solubility conditions of N in the growth process of nitride, suppressing growth of polycrystal nitride, and improving the growth rate of crystals and the utilization rate of raw materials.

The structure of the autoclave apparatus designed in the invention can overcome the problem that products such as polycrystal nitride are generated in the cooling process due to low temperature after the growth of nitride is completed. The traditional autoclave apparatus is directly cooled after the growth is completed, growth of undesirable nitrides such as polycrystal nitride and surface roughness occur in the cooling process as the residual melted raw materials remain in contact with the single crystal nitride. The autoclave apparatus designed in the invention comprises two or more chambers, so that each liquid level in the chamber can be controlled flexibly by using the pressure difference. After the growth is completed, the pressure in the crystal growth chamber is increased to be higher than that in the crystal pre-growth chamber, so that the residual melt solution in the growth chamber flows back to the pre-growth zone. This can efficiently isolate the melted raw materials from the nitride bulk single crystal in the crystal growth chamber, and thus blocks the growth of material in the cooling process, efficiently controls the growth of the undesirable nitride during cooling process, and improves the quality of the nitride bulk single crystal.

DESCRIPTION OF ACCOMPANYING DRAWING REFERENCE SIGNS

11: the crystal pre-growth chamber of embodiment 1; 12: the crystal growth chamber of embodiment 1; 13: the transition chamber; 14: the crystal pre-growth chamber of embodiment 2; 15: the crystal growth chamber of embodiment 2; 21: the heating apparatus for the crystal pre-growth chamber of embodiment 1; 22: the heating apparatus for the crystal growth chamber of embodiment 1; 23: the heating apparatus for the transition chamber; 24: the heating apparatus for the crystal pre-growth chamber of embodiment 2; 25: the heating apparatus for the crystal growth chamber of embodiment 2; 31: the communication control apparatus where the raw materials in the pre-growth chamber enters the channel of embodiment 1; 32: the communication control apparatus where the nitrogen-containing reactant in the growth chamber enters the channel of embodiment 1; 33: the communication control apparatus connecting the crystal pre-growth chamber and the crystal growth chamber; 34: the valve connecting the crystal pre-growth chamber and the transition chamber; 35: the valve connecting the transition chamber and the crystal growth chamber; 36: the communication control apparatus where the nitrogen-containing reactant enters the transition chamber; 37: the communication control apparatus where the nitrogen-containing reactant enters the crystal pre-growth chamber of embodiment 2; 38: the communication control apparatus where the nitrogen-containing reactant enters the crystal growth chamber of embodiment 2; 4: the nitrogen-containing reactant gas delivery pipe of embodiment 1; 5: the gas storage tank of embodiment 1; 41: the nitrogen-containing reactant gas delivery pipe of embodiment 2; 51: the gas storage tank of embodiment 2; 61: the gauze filter between the crystal pre-growth chamber and the crystal growth chamber; 62: the gauze filter between the crystal pre-growth chamber and the transition chamber; 63: the gauze filter between the transition chamber and the crystal growth chamber; 7: the seed crystal template of embodiment 1; 71: the seed crystal template of embodiment 2; 8: the dissolved raw material solution of embodiment 1; 81: the dissolved raw material solution of embodiment 2.

DETAILED DESCRIPTION OF THE INVENTION

For further understanding of features, technical means, and the specific objects and functions achieved of the invention, the advantages and spirit of the invention are parsed and the invention is further set forth by the following embodiments.

Figure 1:
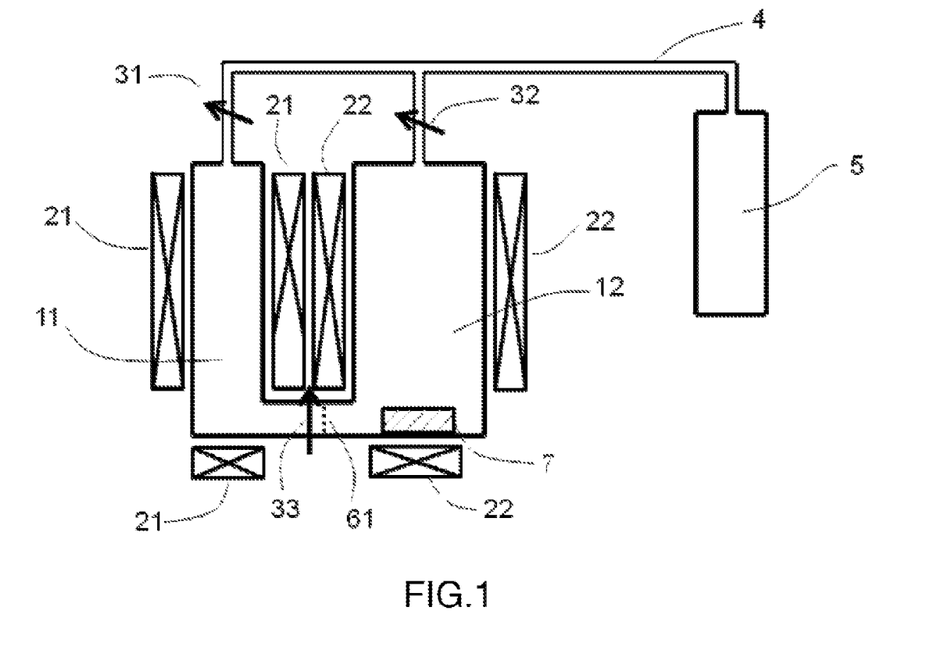
FIG. 1 shows the schematic cross section of a novel autoclave structure of the invention.

The structure of a autoclave apparatus for growing nitride bulk single crystal is shown in FIG. 1. The core part comprises two chambers: a pre-growth chamber and a growth chamber; secondly, the core part consists of a nitrogen storage tank, valves, a pressure controllers, flow gauges, gas delivery pipes and heating apparatuses. The heating apparatus can be but is not limited to resistance heating and radio-frequency heating. The pre-growth chamber and the growth chamber can be connected with each other directly or through a thermal insulation pipe or a transition chamber (transition chamber as an example in embodiment 2). The pre-growth chamber is a control and auxiliary zone for conditions required by the reaction, and the growth chamber is a zone for growing the nitride bulk single crystal.

The following two embodiments are illustrated in detail in conjunction with FIG. 1-10.

Embodiment 1

An apparatus for growing nitride bulk single crystal is a autoclave capable of withstanding high temperature and high pressure. The core structure of the autoclave comprises a crystal pre-growth chamber 11 and a crystal growth chamber 12 connected with each other. The crystal pre-growth chamber 11 is heated by a heating apparatus 21, and the raw materials such as nitrogen-containing reactants and the auxiliary pressure are controlled by a communication control apparatus 31. The crystal growth chamber 12 is heated by a heat source of a heating apparatus 22, and the raw materials such as nitrogen-containing reactants and the auxiliary pressure are controlled by a communication control apparatus 32. A gas storage tank 5 is a gas tank for storing the nitrogen-containing reactant and providing pressure control and N raw material in the growth process.

The exteriors of the outer side and the bottom of the crystal pre-growth chamber 11 are provided with a heating apparatus 21, the exteriors of the outer side and the bottom of the crystal growth chamber 12 are provided with a heating apparatus 22, a communication control apparatus 33 for controlling communication or separation is arranged between the crystal pre-growth chamber 11 and the crystal growth chamber 12, the crystal pre-growth chamber 11 is orderly connected with the nitrogen-containing reactant gas delivery pipe 4 and the gas storage tank 5 by the communication control apparatus 31 arranged above, and the crystal growth chamber 12 is orderly connected with the nitrogen-containing reactant gas delivery pipe 4 and the gas storage tank 5 by the communication control apparatus 32 arranged above.

As a further description of the abovementioned apparatus for growing nitride bulk single crystal, a gauze filter 61 is arranged on one side of the communication control apparatus 33 for preventing the undissolved raw materials or impurities of the crystal from entering the crystal growth chamber 12

Figure 2:
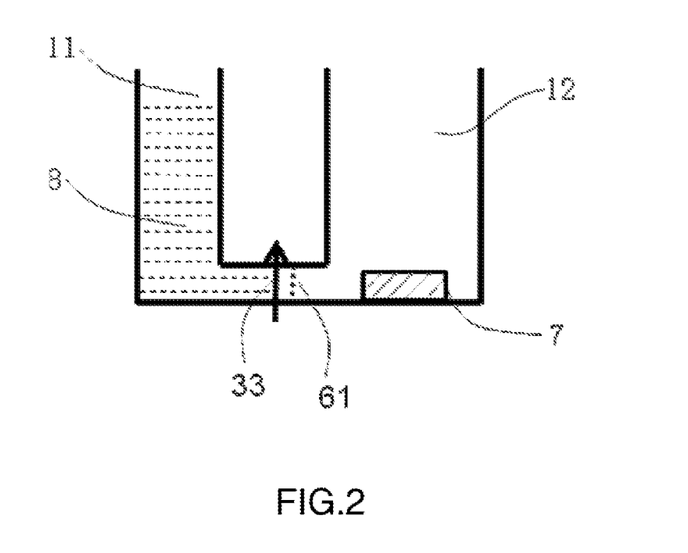
FIG. 2 shows the schematic cross section of heating and dissolving of the raw materials in the crystal pre-growth chamber before growth of crystal of the invention.
Figure 3:
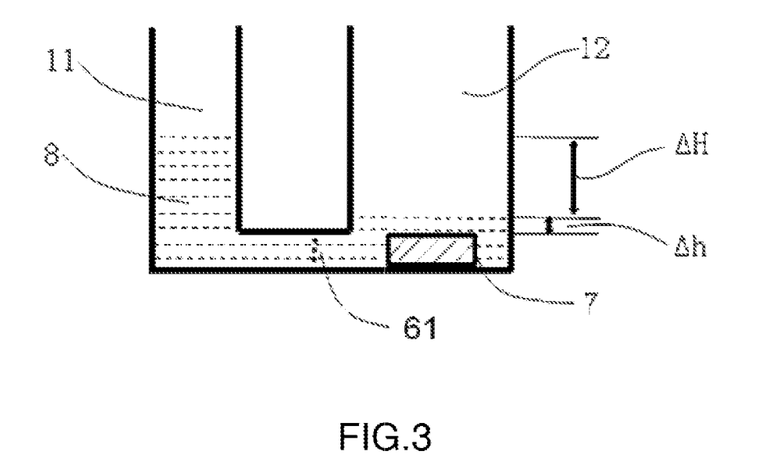
FIG. 3 shows the schematic diagram of controlling of liquid level difference of the raw material solution in the crystal growth process of the invention.
Figure 4:
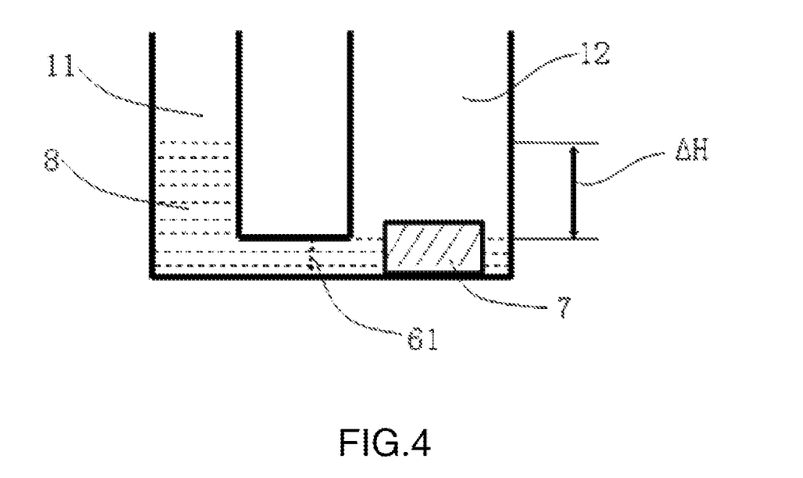
FIG. 4 shows the schematic diagram of the liquid level difference of the residual raw material solution after completion of the growth of crystal of the invention.

FIGS. 2, 3, and 4 illustrate the control principle and method for the designed autoclave apparatus for growing a gallium nitride bulk single crystal.

First, the raw materials such as gallium and the catalyst are put into the crystal pre-growth chamber of the autoclave apparatus, and the communication control apparatus 33 is switched off at this point. The temperature of the crystal pre-growth zone is controlled by controlling the heat source of the heating apparatus 21 and the pressure of the pre-growth zone and the supplement of the N raw materials are controlled by the valve of the communication control apparatus 31. The growth method of the crystal can be both spontaneous nucleation and induced growth of the seed crystal template. When induced growth is adopted for the seed crystal template 7, the seed crystal template 7 of gallium nitride is put in the crystal growth chamber, and the growth conditions in the crystal growth chamber are controlled by controlling the heat source of the heating apparatus 22 and the communication control apparatus 32. Before the N concentration in the raw material solution in the crystal pre-growth chamber 11 reaches the oversaturated condition, the communication control apparatus 33 is switched of, and the crystal pre-growth chamber 11 is isolated from the crystal growth chamber 12, as shown in FIG. 2.

When the raw material solution 8 in the crystal pre-growth chamber 11 is in the oversaturation state, the pressure difference between the crystal pre-growth chamber 11 and the crystal growth chamber 12 is adjusted, and the communication control apparatus 33 is switched on to enter the raw material solution 8 into the crystal growth chamber 12, as shown in FIG. 3. The gauze filter 61 can prevent the undissolved raw materials and impurities from entering the growth zone and reduce the impurity content in the crystal. The communication control apparatus 31 and the communication control apparatus 32 are adjusted. The liquid level difference ΔH between the two chambers is controlled by regulating the pressure difference between the two chambers so as to indirectly control the distance Δh from the liquidus surface of the raw material solution to the upper surface of the seed crystal in the crystal growth chamber within the free path diffusion range of the growth conditions of N ions, so that the nucleation growth of N/Ga is preferentially performed on the surface of the seed crystal. Meanwhile, since the spontaneous nucleation of polycrystal on the surface is efficiently suppressed, it is convenient to efficiently diffuse N ions into the melt close to the seed crystal and supplement the consumption of N in time, and the oversaturation concentration of N ions close to the upper surface of the seed crystal is kept. Since the raw materials are already in the oversaturation state in the crystal pre-growth zone, the raw material solution beginning to contact the surface of the seed crystal is already under the oversaturated condition, and therefore the seed crystal is under the oversaturated condition at the beginning of the growth, thereby overcoming the unstable unsaturation state under the heating conditions of the traditional autoclave apparatus. Secondly, control of the range of Δh can efficiently supplement the N consumed due to the reaction of melt on the surface of the seed crystal and maintain the oversaturation state of N in the solution. This can efficiently suppress generation of polycrystal gallium nitride on the surface of the seed crystal and at the same time is beneficial for improving the utilization rate of gallium and the growth rate of crystal.

After the growth is completed, the pressure is adjusted by the communication control apparatus 31 and the communication control apparatus 32, the pressure difference between the crystal pre-growth chamber 11 and the crystal growth chamber 12 is reversely controlled, so that the pressure of the crystal pre-growth zone is lower than that of the reaction zone. The residual raw material solution 8 in the reaction zone flows back into the crystal pre-growth chamber, so that the liquid level is lower than the upper surface where the nitride bulk single crystal grows, and the contact between the surface where the nitride grows and the raw material solution required by the reaction is terminated, as shown in FIG. 4. This can avoid formation of polycrystals or multi-phase nitride caused by a reduction of N solubility with temperature in the cooling process, thereby improving the quality of the product. Such a design breaks through the problem where the traditional autoclave starts growing on the surface of the seed crystal under the unsaturation conditions and thus causes difficulty of polycrystal gallium nitride synthesis. Secondly, the liquidus level of the upper surface of the seed crystal is precisely controlled, which can efficiently suppress the generation of polycrystals at the gas-liquid interface and supplement the consumption of N in the growth process in time. Again, generation of undesirable products like multi-phase polycrystals caused in the cooling stage can be overcome, which is beneficial for achieving scaled growth of high-quality nitride.

Embodiment 2

Figure 5:
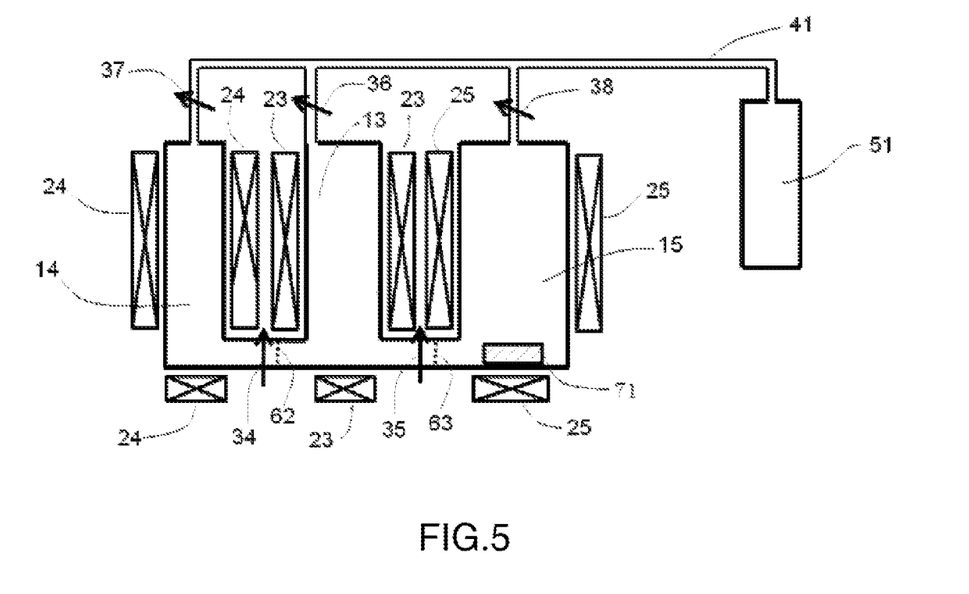
FIG. 5 shows the schematic cross section of another novel autoclave structure of the invention.

In order to achieve the pre-growth conditions and flexible and efficient control of the growth conditions, the invention designs another novel autoclave apparatus structure and method for growing nitride bulk single crystal, as shown in FIG. 5. The core structure of the autoclave comprises three parts: a crystal pre-growth chamber 14, a crystal growth chamber 15 and a transition chamber 13. The crystal pre-growth chamber 14 and the crystal growth chamber 15 are connected with each other by the transition chamber 13. The transition chambers 13 can be orderly communicated, wherein the communication control apparatus 34 and the communication control apparatus 35 respectively control the separation and communication between the transition chamber 13 and the crystal pre-growth chamber 11, and between the transition chamber 13 and the crystal growth chamber 15. The crystal pre-growth chamber is a primary control zone for the conditions required by the reaction, and the crystal growth chamber is used for the nitride single crystal material. The crystal pre-growth chamber 14 is heated by the heat source of the heating apparatus 24, and the nitrogen raw material and the auxiliary pressure are controlled by the communication control apparatus 37. The transition chamber 13 is heated by the heat source of the heating apparatus 23, and the N raw material and the auxiliary pressure are controlled by the communication control apparatus 36. The crystal growth chamber 15 is heated by the heat source of the heating apparatus 25, and the nitrogen raw material and the auxiliary pressure are controlled by the communication control apparatus 38. The communication control apparatuses 36, 37, and 38 are respectively connected with the gas delivery pipe 41 and the gas storage tank 51, and the gas storage tank 51 is a gas tank for storing the nitrogen-containing reactant and for providing pressure control and N raw material in the growth process.

Figure 6:
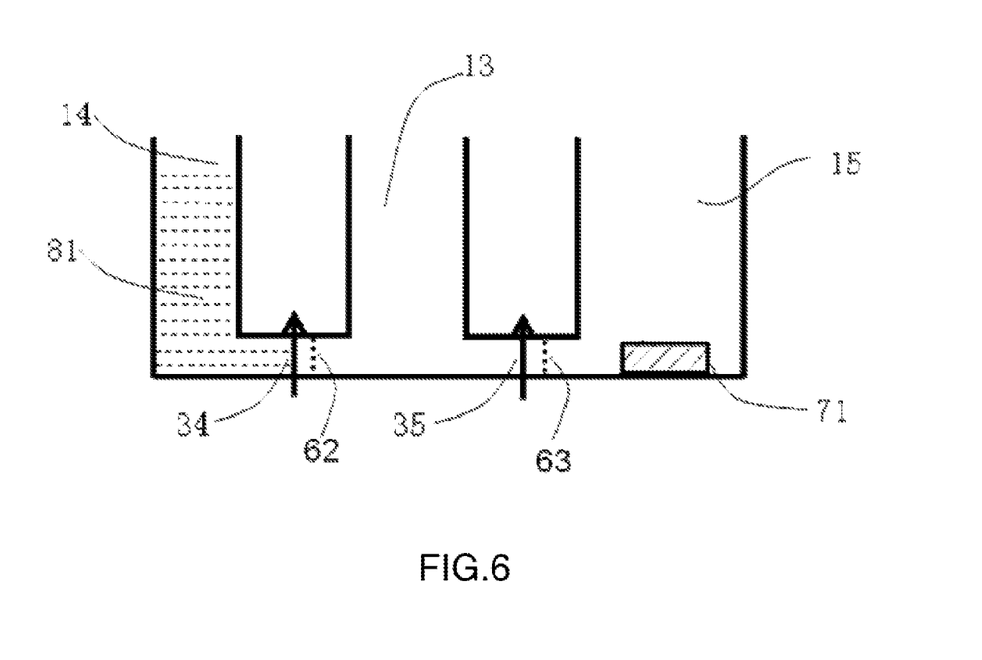
FIG. 6 shows the schematic cross section of heating and dissolving of the raw materials in the crystal pre-growth chamber before the growth of crystal in the other novel autoclave structure of the invention.
Figure 7:
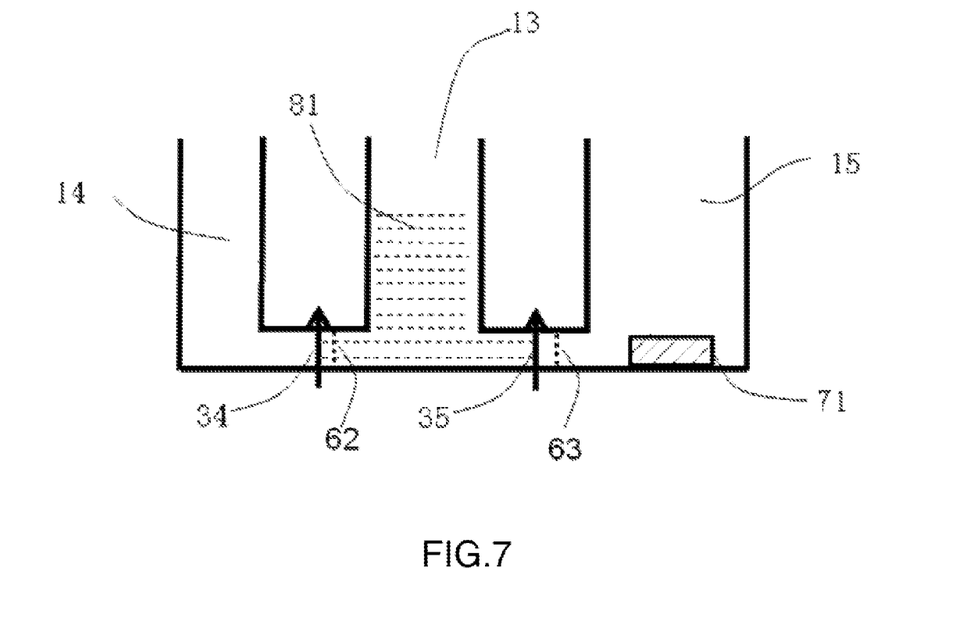
FIG. 7 shows the schematic diagram of the raw material solution in the transition chamber of the another novel autoclave structure of the invention.
Figure 8:
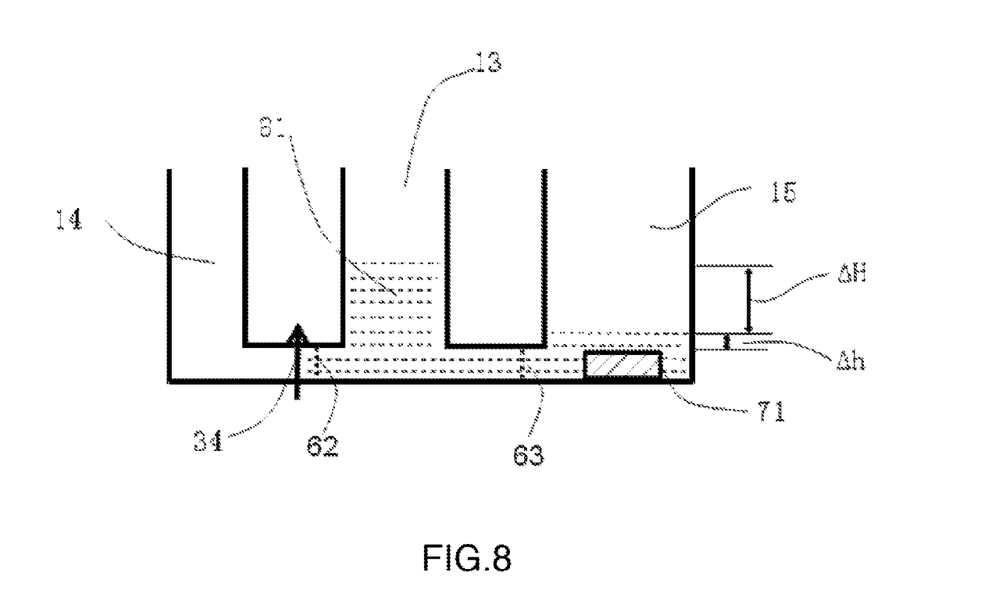
FIG. 8 shows the schematic diagram of controlling of the liquid level difference of the raw material solution in the crystal growth process in the other novel autoclave structure of the invention.
Figure 9:
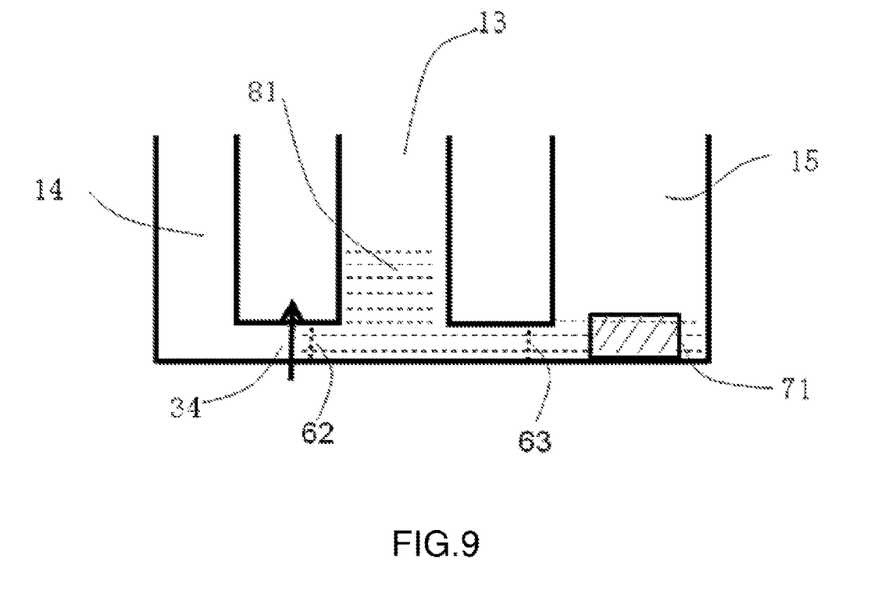
FIG. 9 shows the schematic diagram of the residual raw material solution flowing back to the transition chamber after completion of the growth of crystal in the other novel autoclave structure of the invention.
Figure 10:
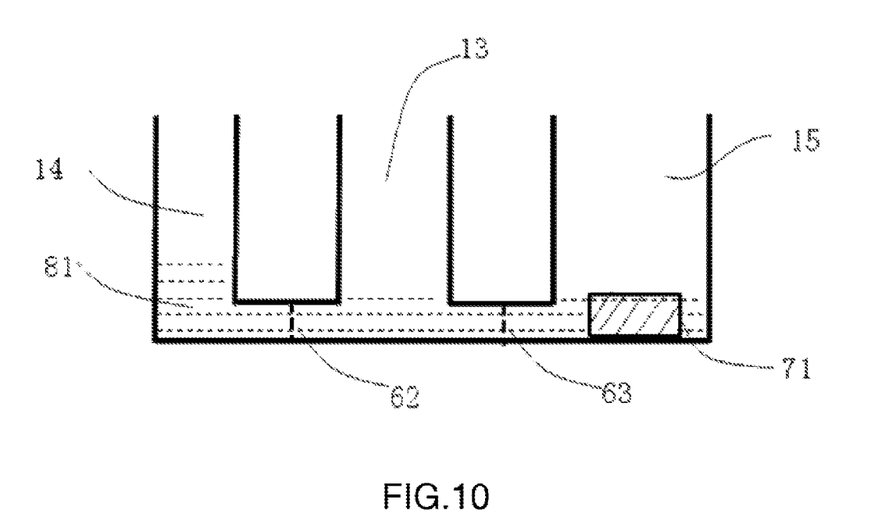
FIG. 10 shows the schematic diagram of the residual raw material solution flowing back to the pre-growth zone of the transition chamber after completion of the growth of crystal in the other novel autoclave structure of the invention.

A control method is designed for the novel autoclave apparatus structure for growing nitride bulk single crystal. The function of the pre-growth zone of the autoclave apparatus structure is embodied in quickly achieving the oversaturation conditions of N ions in the melt with high temperature and high pressure conditions, and reducing the time required by N to reach the oversaturation state in the melt before growing. The conditions for the transition chamber 13 and the crystal growth chamber 15 are set according to those required by growth. The liquid level difference Δh is controlled by the pressure, the growth is confined in the transition chamber 13, and the crystal growth chamber 15. The setting of the oversaturation conditions for the crystal pre-growth chamber 14 is not affected by the conditions for the crystal growth chamber. Therefore, the setting of the oversaturation conditions for the crystal pre-growth chamber can be more flexible. After adding the raw materials in the crystal pre-growth chamber 14, as shown in FIG. 6, the conditions for the raw material solution 81 in the crystal pre-growth chamber 14 are set according to the actual requirements. When the raw material solution 81 melt in the crystal pre-growth chamber 14 reaches the oversaturation conditions, the communication control apparatus 34 is switched on, the pressure of the transition chamber 13 is well-controlled, and the communication control apparatus 34 is switched off after the raw material solution 81 enters the transition chamber, as shown in FIG. 7. The gauze filter 62 prevents the undissolved raw materials and impurities from entering the transition chamber 13. If a plurality of transition chambers is provided, a communication control apparatus and a profound gauze filter for further preventing the undissolved raw materials from entering the next transition chamber or reducing impurities in the crystal should be arranged between two transition chambers, the pressure between the two transition chambers is well-controlled, and the raw material solution 81 orderly passes through the various transition chambers (the structures of the plurality of transition chambers can be easily known and thus not shown in the figures). When the raw material solution 81 enters the transition chamber 13 adjacent to the crystal growth chamber 15, and the communication control apparatus 35 is switched on, as shown in FIG. 8. The transition chamber 13 and the crystal growth chamber 15 are communicated. The gauze filter 63 further prevents the undissolved raw materials and impurities from entering the growth zone and can efficiently reduce the impurities in the crystal. The pressure and temperature of the transition chamber 13 and the crystal growth chamber 15 are well-controlled. ΔH and Δh are controlled by using the pressure difference between the transition chamber 13 and the crystal growth chamber 15 for growing the bulk single crystal gallium nitride material. After the growth is completed, the pressure difference between the transition chamber 13 and the crystal growth chamber 15 is reversely regulated, such that the pressure of the crystal growth chamber 15 is higher than that of the transition chamber 13, as shown in FIG. 9, thereby pressing the residual raw material solution in the growth back to the transition chamber 15, or the communication control apparatus 34 is switched on again, such that the residual raw material solution in the growth flows back to the transition chamber 13 and the crystal pre-growth chamber 14, as shown in FIG. 10. Liquid level drawdown of the raw material solution can terminate the contact between the surface of the crystal and the liquid, which avoids generation of polycrystals or multi-phase nitrides caused by solubility reduction of N with temperature in the cooling process and improves the crystal quality.

In the two abovementioned embodiments, each communication control apparatus is preferably a valve. When the growth method of crystal is induced growth of a seed crystal template, a seed crystal template 7 and a seed crystal template 71 are respectively placed in the crystal growth chamber 12 and the crystal growth chamber 15. The seed crystal template can simply be a sapphire substrate, a silicon carbide substrate, a silicon substrate, or a composite substrate formed by depositing GaN film on any of the abovementioned substrates or a GaN self-supporting substrate. The surface of the abovementioned substrate is polar C plane or nonpolar or semi-polar. The mentioned substrate can be placed horizontally, vertically, or in other ways. Moreover, the mesh size of the gauze filter is 10-1000 meshes, and the material for the gauze filter can be but is not limited to stainless steel, platinum, or other alloy materials with high temperature resistance, high pressure resistance, and corrosion resistance. The raw materials comprise gallium (Ga), nitrogen-containing reactant gas and a mixture of alkali metals and alkaline-earth metals. Gallium (Ga) can be replaced with Al or In without changing the manufacturing method. The nitrogen-containing reactant gas comprises nitrogen or ammonia gas, or a mixture of nitrogen and ammonia gasses.

The two abovementioned embodiments are only examples of the invention, but according to the principle of the invention, various other solutions can be derived, including various solutions combining these solutions. As long as they involve using multiple chambers of the autoclave, by separating the preheating of the raw materials and growth process of the crystal, the technical solutions of regulating the oversaturation conditions of N in the reaction solution to improve the growth quality of the crystal, and using the pressure difference to regulate the distance from the liquid level of the reaction solution to the surface of the seed crystal to suppress the spontaneous nucleation of polycrystal at the gas-liquid interface and to improve the growth rate of crystal are included within the scope of the invention.

The invention has the following advantages:

1. Using a multi-chamber apparatus comprising a pre-growth zone and a growth zone, the oversaturation reaction conditions for growth of the nitride bulk single crystal can be efficiently regulated by controlling the concentration of the saturated solution in the pre-growth chamber being controlled independently, thereby improving the growth quality of the crystal;

2. The pressure difference between the two chambers is regulated with the principle of a communicating vessel so as to control the liquid level difference from the upper surface of the seed crystal to the melt, so that nucleation growth of N/Ga is preferentially performed on the surface of the seed crystal, spontaneous nucleation of polycrystals at the gas-liquid interface is suppressed, the consumption of N in the reaction is efficiently supplemented, the stability of growth conditions are maintained, the growth rate of crystal and the utilization rate of raw materials are improved, and the production cost is reduced;

3. After the growth is completed, the pressure difference between the pre-growth chamber and the growth chamber is reversely adjusted, forcing the solution flowing back to the pre-growth chamber or the transition chamber, and suppressing generation of polycrystal or multi-phase nitrides caused by cooling.

The invention discloses a method for a improved autoclave apparatus for preparing liquid phase epitaxy of nitride by Na Flux, efficiently breaks through the detects of the traditional single-chamber autoclave controls the conditions flexibly and has important and wide application in the future industry.

The abovementioned embodiments only show several implementations of the invention, but the specific and particular description cannot be interpreted as limit to the scope of the patent of the invention. It should be noted that, for persons having ordinary skill in the art, various substituted, changed and modified technical solutions made without departing from the concept of the invention all belong to the scope of protection of the invention. Therefore, the scope of protection of the patent of the invention should be subject to the appended claims.

What is claimed is:

1. A method for growing nitride bulk single crystal, characterized by comprising the following steps:
   A. arranging a crystal pre-growth chamber, a crystal growth chamber and a valve located between the abovementioned two chambers, placing a seed crystal in the crystal growth chamber, and switching off the valve between the abovementioned two chambers;
   B. introducing raw materials in the crystal pre-growth chamber; when the raw materials are dissolved to meet the stable oversaturation conditions required by the growth, switching on the valve between the crystal pre-growth chamber and the crystal growth chamber; and C. entering the raw material solution in the stable oversaturation state into the crystal growth chamber and starting crystal growth;

wherein the flow process of the raw material solution in the stable oversaturation state comprises: in the crystal growth process, regulating the pressure difference between the crystal pre-growth chamber and the crystal growth chamber, thereby regulating the liquid level difference between the two chambers so as to adjust the surface of the seed crystal to the liquid level difference $\Delta h$, restricting the distance $\Delta h$ from the melt liquidus surface in the crystal growth chamber to the upper surface of the seed crystal meet with the diffusion free path of N ions at the growth conditions; after the crystal growth is completed, regulating the pressure difference between the crystal pre-growth chamber and the crystal growth chamber to force the raw material solution in the crystal growth to flow back to the crystal pre-growth chamber; and so, when the liquid level of the raw material solution is lower than the upper surface of the bulk single crystal material, the contact between the surface of the nitride bulk single crystal and the raw material solution is terminated.

2. A method for growing nitride bulk single crystal, characterized by comprising the following steps:

A. arranging a crystal pre-growth chamber, a crystal growth chamber, at least one transition chamber for connecting the crystal pre-growth chamber with the crystal growth chamber and a valve located at the communication between the abovementioned chambers; placing a seed crystal in the crystal growth chamber; and switching off the valve located at the communication between the abovementioned chambers;

B. introducing raw materials in the crystal pre-growth chamber; when the raw materials are dissolved to meet the stable oversaturation conditions required by the growth, switching on the valve between the crystal pre-growth chamber and the adjacent transition chamber; and entering the raw material solution into the transition chamber; and C. switching on the valve between the crystal growth chamber and the adjacent transition chamber, entering the raw material solution in a stable oversaturation state into the crystal growth chamber and starting crystal growth;

wherein in the growth process of the crystal, the flow process of the raw material solution in the stable oversaturation state comprises:

regulating the pressure difference between the crystal pre-growth chamber and the adjacent transition chamber, terminating the connection between the crystal pre-growth chamber and the adjacent transition chamber after the raw material solution in the oversaturation state enters the adjacent transition chamber, wherein the internal liquid level of the crystal pre-growth chamber is lower than that of the adjacent transition chamber;

entering the raw material solution in the stable oversaturation state into the transition chamber adjacent to the crystal growth chamber; by regulating the pressure difference between the crystal growth chamber and the adjacent transition chamber, regulating the liquid level difference $\Delta H$ of the two chambers so as to adjust the difference $\Delta h$ from the surface of the seed crystal to the liquid level, controlling $\Delta h$ from the liquidus surface of the raw material solution in the growth chamber to the upper surface of the seed crystal meet with diffusion free path of N ions at the growth conditions;

after the crystal growth is completed, the flow process of the raw material solution in the stable oversaturation state comprises: regulating the pressure difference between the crystal growth chamber and the adjacent transition chamber to enable the raw material solution in the crystal growth to flow back into the adjacent transition chamber; and so, when the liquid level of the raw material solution flowing back is lower than the upper surface of the bulk single crystal material, the contact between the surface of the nitride bulk single crystal and the growth solution is terminated.

3. The method for growing nitride bulk single crystal according to claim 1, characterized in that, when the number of the transition chambers for connecting the crystal pre-growth chamber and the crystal growth chamber is two or more, by regulating the pressure difference between the two adjacent transition chambers, the communication of the two adjacent transition chambers is terminated after the raw material solution in the stable oversaturation state enters the next transition chamber.

* * * * *